United States Patent [19]
Suzuki et al.

[11] Patent Number: 5,790,078
[45] Date of Patent: Aug. 4, 1998

[54] SUPERCONDUCTING MIXER ANTENNA ARRAY

[75] Inventors: Katsumi Suzuki; Youichi Enomoto; Shoji Tanaka; Keiichi Yamaguchi, all of Tokyo, Japan; Arthur T. Murphy, Chadds Ford, Pa.

[73] Assignee: NEC Corporation, Tokyo, Japan

[21] Appl. No.: 742,386

[22] Filed: Nov. 1, 1996

Related U.S. Application Data

[63] Continuation-in-part of Ser. No. 327,675, Oct. 21, 1994, abandoned.

[30] Foreign Application Priority Data

Oct. 22, 1993 [JP] Japan .................... 5-264945

[51] Int. Cl.$^6$ .................................... H01Q 1/38
[52] U.S. Cl. .................... 343/700 MS; 343/853; 505/201; 29/600
[58] Field of Search ............ 343/700 MS, 846, 343/853, 852; 505/201; 333/101, 104, 128, 246, 263; 29/600; H01Q 1/38

[56] References Cited

U.S. PATENT DOCUMENTS

| | | | |
|---|---|---|---|
| 4,777,490 | 10/1988 | Sharma et al. | 343/700 MS |
| 5,105,200 | 4/1992 | Koepf | 343/700 MS |
| 5,477,419 | 12/1995 | Goodman et al. | 361/760 |

FOREIGN PATENT DOCUMENTS

| | | |
|---|---|---|
| 2394896 | 1/1979 | France . |
| 3613258 | 10/1987 | Germany . |
| 2223130 | 3/1990 | United Kingdom . |

OTHER PUBLICATIONS

Piel et al.; "High Temperature Superconductors in High Frequency Fields—Fundamentals and Applications"; Proc. of the 4th International Symposium on Super–conductivity, Oct. 1991, Tokyo, pp. 925–930.

Balasubramaniyan et al.; "An Eight MESFET Periodic Spatial Power Combiner"; 1993 IEEE MTT-S Digest, pp. 611–614.

Lewis et al.; Performance of TlCaBaCuO 30 GHz Element Antenna Array; IEEE Transactions on Applied Superconductivity, vol. 3, No. 1, Mar. 1993, pp. 2844–2847.

Banerjee et al.; "An X–Band Phased Array Microwave/Photonic Beamforming Network"; 1993 IEEE MTT-S Digest, pp. 505–508.

Suzuki et al.; "Y–Ba–Cu–O Mixer Antenna Array at 23 Ghz"; 1994 IEEE MTS-S International Microwave Symposium Digest (1994), pp. 1001–1004.

Suzuki et al.; High Ic Rn Y–Ba–Cu–O Junctions for Microwave Applications (Mixer Antenna); 6th International Symposium on Superconductivity (ISS–93) (Oct. 1993).

Neumann et al.; "YBCO–Josephson–Junctions on MgO Fabricated by a Focused Ion Beam"; Advances in Superconductivity V, 5th International Symposium on Superconductivity (ISS '92) (Nov. 1992), pp. 1091–1094.

K. Suzuki et al.; "Y–Ba–Cu–O Mixer Antenna Array at 23GHz"; 1994 IEEE MTS-S International Microwave Symposium Digest, pp. 1001–1004.

K. Suzuki et al.; High Ic-Rn Y–Ba–Cu–O Junctions for Microwave Applications (Mixer Antenna); 6th International Symposium on Superconductivity; Oct. 193, Hiroshima, Japan.

Ch. Neumann et al.; "YBCO–Josephson–Junctions on MgO Fabricated by a Focused Ion Beam"; Advances in Superconductivity V (Proceedings of the 5th International Symposium on Superconductivity (ISS '92), Nov. 16–19, 1992, Kobe, pp. 1091–1094.

*Primary Examiner*—Hoanganh T. Le
*Attorney, Agent, or Firm*—Whitham, Curtis & Whitham

[57] ABSTRACT

A superconducting patch antenna array, operative at a temperature lower than or equal to that of liquid nitrogen, includes a superconducting mixer comprising at least one non-linear Josephson junction to transform the received high frequency signal to a lower intermediate frequency for purposes of reducing the transmission loss and thereby increasing the antenna performance.

6 Claims, 6 Drawing Sheets

5,790,078

SUPERCONDUCTING MIXER ANTENNA ARRAY

This application is a continuation-in-part of application Ser. No. 08/327,675, filed Oct. 21, 1994 now abandoned.

BACKGROUND OF THE INVENTION

1. Field of the Invention

This invention relates to a superconducting patch antenna array, operative at a temperature lower than or equal to that of liquid nitrogen, which includes a superconducting mixer comprising at least one non-linear Josephson junction to transform the received high frequency signal to a lower intermediate frequency for purposes of reducing the transmission loss and thereby increasing the antenna performance.

2. Description of the Related Art

In patch antenna arrays, a network of feed lines, or a feed network, is necessary to collect the received radio frequency (RF) signal and transmit this signal to signal detection circuitry. (In certain translations of non-English discussions of this topic, the term "feed network" may appear as "signal transmission path pattern" or "current introduction terminal pattern".). The resistive transmission loss in these feed networks is a limiting factor in the performance of antenna arrays. As the received frequency increases, the losses become greater due to skin effect in normal conductors. Semiconductor amplifiers and optical cables have been proposed to overcome this loss (see Balasubramanian, et. al. "An Eight MOSFET Periodic Spatial Power Combiner", 1993 IEEE MTT-S Digest, pp. 811 and Banerjee, et. al. "An X-Band Phased Array Microwave/Photonic Beamforming Network", IEEE MTT-S Digest, pp. 505) but these methods require difficult construction and do not allow economical monolithic structures.

It has been proposed to use high temperature superconductors (HTS) in these feed networks. Dinger, et. al. "A Survey of Possible Passive Antenna Applications of High Temperature Superconductors" (esp. FIGS. 18 and 19), IEEE Trans. on Microwave Theory and Techniques, Vol. 39, No. 9, September 1991, pp. 1498 and Lewis et. al. "Performance of TlCaBaCuO 30 GHz Element Antenna Array", IEEE Trans. on Applied Superconductivity, Vol. 3, March 1993, pp. 2844 have reported on this use. However, even HTS feed networks exhibit increasing losses as the frequency increases and, with currently known HTS materials, resistance equal to that of copper conductors (at 77 degrees K) is reached in the range of tens to hundreds of GHz (see Piel, et. al. "High Temperature Superconductors in High Frequency Fields-Fundamentals and Applications" (esp. FIG. 2), Proceedings of the 4th International Symposium on Superconductivity, October 1991, Tokyo, pp. 925). This occurs because the high frequency resistance of the HTS materials increases as the square of the frequency whereas the skin effect resistance of normal conductors increases as the square root of the frequency.

Therefore, in order to receive very high radio frequencies, a new approach is needed to reduce the losses in the antenna feed network. This can be achieved by transforming the received radio frequency (RF) signal to a lower intermediate frequency (IF) signal by mixing with a local oscillator (LO) signal. This has been demonstrated using normal (non-superconducting) conductors and discrete semiconductor components such as taught in UK Patent Application GB 2,223,1 30A, Patch Antenna Receiving System. However, it is desirable to reduce losses even more by using superconductors and also allow more effective fabrication in an integrated monolithic structure.

It is a general object of the present invention to solve the problems of the prior art set forth above.

Another and more specific object of the present invention is to provide a device that makes it possible to take advantage of the low resistance of superconducting materials in feed networks for patch antennas that are used at very high frequencies by converting the high frequency to a lower frequency immediately at the antenna.

A further object of this invention is to provide a low loss patch antenna array which can be fabricated as a monolithic structure thus providing high density packaging at a low cost.

A further object of this invention is to permit the elimination of amplifiers or semiconductor devices that have been used to overcome system losses at very high frequencies.

SUMMARY OF THE INVENTION

This invention provides a superconductor mixing antenna array comprising: a substrate; a plurality of superconductor film wiring patterns formed on one surface of said substrate, each superconductor film wiring pattern comprising: an antenna patch for receiving a radio frequency signals; a non-linear superconductor element connected to each antenna patch for transforming the frequency of the received RF signal to an intermediate frequency signal by mixing with a local oscillator signal, thus forming an antenna/mixer element; and a superconductor feed network connected to each of the antenna/mixers which transmits the IF signal to a signal detection means at its output; and a ground plane on the opposite surface of the substrate.

Preferably, the superconductor film wiring pattern is formed from a high temperature superconducting oxide such as a YBaCuO compound This invention further provides a process for the fabrication of a superconductor mixing antenna array comprising a non-linear superconductor element comprising the steps of: depositing a protection layer on a substrate in the region where the non-linear element is to be formed; focusing an ion beam on selected areas of the protected substrate where the non-linear element is to be formed; removing the protection layer; depositing a superconductor oxide film on both the irradiated and non-irradiated regions of the substrate to form modified superconductor film regions and un-modified superconductor regions, respectively; patterning an area encompassing the modified superconductor film region to form the non-linear element; and patterning the un-modified superconductor regions to form the antenna patches and the feed network.

BRIEF DESCRIPTION OF THE DRAWINGS

The present invention will be understood more fully from the detailed description below and from the accompanying drawings of the preferred embodiment of the invention, which, however, should not be taken to be limitative to the present invention, but are for explanation and understanding only.

DETAILED DESCRIPTION OF THE INVENTION

The present invention will be discussed hereinafter in detail in terms of the preferred embodiments with reference to the accompanying drawings. In the following description, numerous specific details are set forth in order to provide a thorough understanding of the present invention. It will be obvious, however, to those skilled in the art that the present invention may be practiced without these specific details. In other instance, well-known structures are not shown in detail in order to avoid unnecessarily obscuring the present invention.

Figure 1:
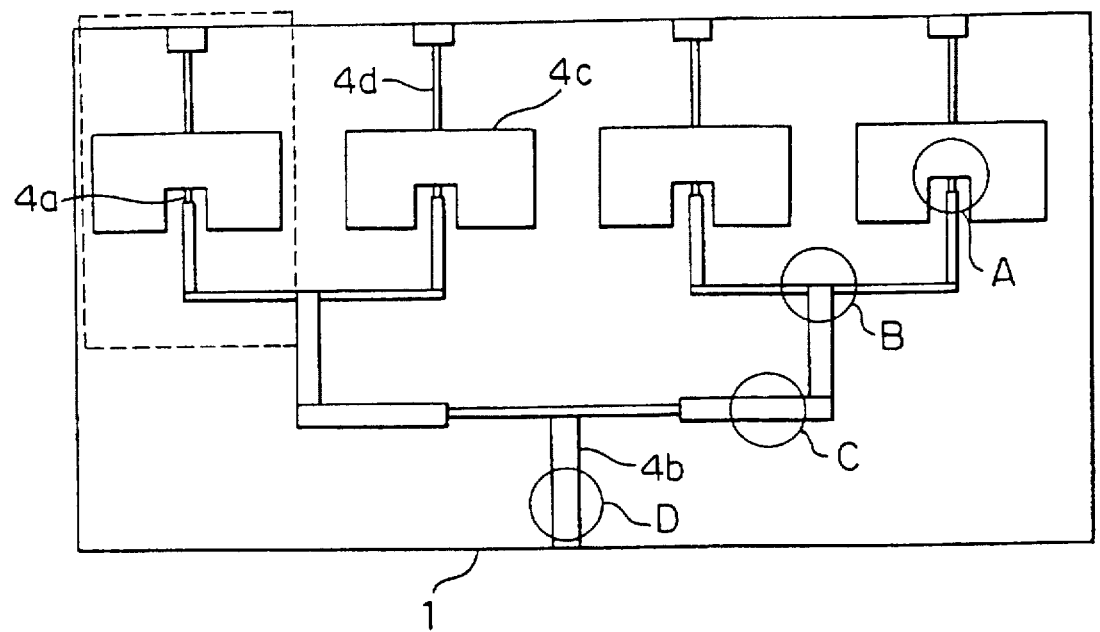
FIG. 1 is a plan view showing an example of one device consisting of four antenna patches in the preferred embodiment of the mixer array antenna

FIG. 1 shows an example of the preferred embodiment of the superconducting mixer array antenna in which four units of a patch antenna 4c are arranged on a substrate 1. All patterns shown are made of thin film oxide superconductor material. The patches 4c are each connected to a non-linear element 4a, which transforms the frequency of the received radio frequency signa to an intermediate frequency signal by mixing a local oscillator signal, thus forming an antenna/mixer element. In a preferred embodiment, is a Josephson junction, and a bias line 4d. The bias line 4d forms a path, through the feed line 4b, for biasing a direct current flow through the non-linear element 4a. The substrate in this embodiment is MgO. A ground plane is disposed on the surface of the substrate opposite the surface on which the superconductor film wiring patterns are formed. An Au thin film ground plane is formed in a thickness of three mm on the entire surface of the substrate 1. The ground plane could also be superconducting but this is not necessary since losses are small in the ground plane.

Figure 5:
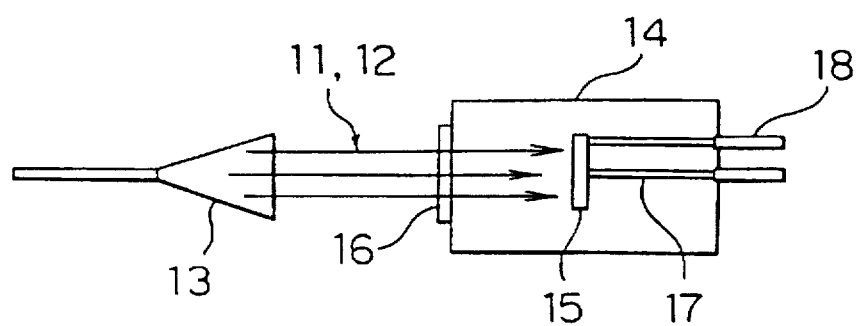
FIG. 5 is a diagrammatic and conceptual illustration showing one example of a functioning superconducting mixer array antenna on which measurements were performed.

The biased non-linear element acts as a mixer which converts the received RF signal into a lower frequency IF signal for transmission through the feed network 4b to a signal detection means, not shown, but located beyond point D in the circuit. A LO signal can be supplied through the feed line wiring pattern 4b or received as a radiated signal by the patch antennas. A method for supplying the LO signal to the patch antenna 4c is illustrated in FIG. 5.

Figure 2:
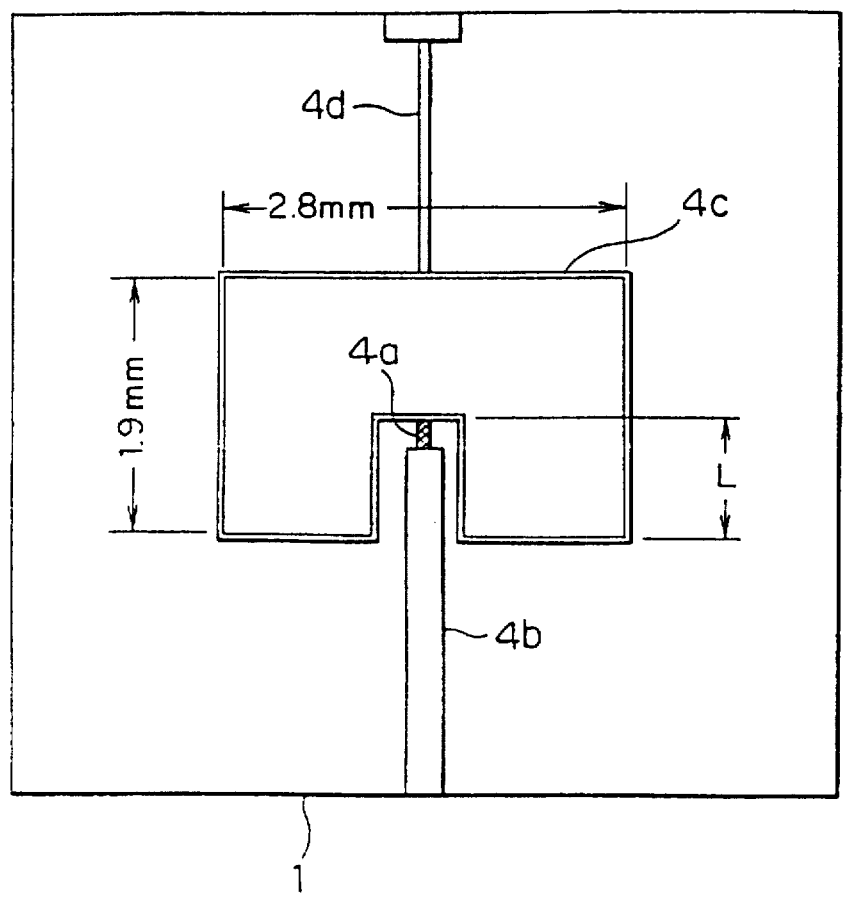
FIG. 2 is a plan view showing one example of a single antenna patch and non-linear element of the preferred embodiment of the mixer array antenna.

The feed network provides for impedance matching. The impedance at location D is 50 ohms as usual for microwave components. The impedance at the antenna can be selected by the depth into the patch of connection point A. (The depth L as shown in FIG. 2.) Therefore, the parallel combinations where the signals are summed up, e. g. B, can be matched to the successive lines. Alternatively, quarter-wave transformers may be used for matching as is shown in Lewis et al, previously cited.

The non-linear element is preferably located at position A rather than B, C or D because 1) the losses are reduced through the feed network at lower frequency so the frequency should be converted as near to the antenna as practicable and 2) the performance of the non-linear elements is reduced at higher power which would exist at point B, C or D due to the summing of power from each patch.

The antenna array must be operated at liquid Nitrogen temperature or lower in order to cause the oxide film to be superconducting.

The antenna array was built and tested (as shown in FIG. 5) in the form of one pair of patch antennas with the non-linear element located at B of FIG. 1 for the demonstration of feasibility. For this embodiment, the antenna impedance was selected as 100 ohms. The 100 ohm feed line width on the MgO substrate was approximately 80 mm and the 50 ohm line width was approximately 500 mm. The entire pattern was formed of YBaCuO oxide superconductor film ("YBCO").

FIG. 2 shows the detail of a single patch, 4c, and its connections. The non-linear element, 4a, is connected between the antenna 4c and the feed network 4b. The bias line 4d is provided and direct current is fed through the feed network as explained for FIG. 1. While the dimensions of the patch in general are determined by the frequency and the thickness and dielectric constant of the substrate, 1, for the embodiment shown with an MgO substrate having 0.5 mm thickness and a dielectric constant of 9.7, for a resonance frequency of 23 GHz, the preferred patch size is 1.9 mm×2.8 mm.

At the center of the patch antenna 4c, the impedance is zero whereas the impedance at the edge is several thousand ohms. Therefore, the desired impedance can be selected by choice of the dimension "L". The impedance of the non-linear element, 4a, in the embodiment shown, is in the range of near zero to several hundred ohms. It is desired to impedance match the non-linear elements to the antenna and feed line. In this embodiment, the non-linear element was composed of six Josephson junctions as shown in FIG. 4 which were fabricated by the process described in FIG. 3. The non-linear element was 5 mm in width and 30 mm in length.

FIG. 3 shows the fabrication process for the non-linear element. FIGS. 3A to 3D show sequential steps for the preferred embodiment of the fabrication process. FIG. 3A shows an Au film 2 formed by vacuum deposition on the overall surface of an MgO(100) substrate 1. The thickness of the Au layer is approximately 100 nm. The substrate 1 is then set within a focused ion beam (FIB) device and irradiated with a $Ga^+$ ion beam at positions where it is desired to form junctions as shown in FIG. 1B, thus forming Ga irradiated regions (implanted layers) 3 on the MgO substrate 1. The FIB is accelerated at 30 KeV with its current controlled in the range of 1pA to 60 nA with a beam diameter of 50 nm. FIG. 3c indicates that the Au film 2 is then removed from the overall surface of the substrate 1. Various methods may be employed for this removal step. The preferred method is $Ar^+$ ion milling at 450 eV. Alternatively, a wet method with a solution of 2.5 wt % of KI and 0.65 wt % iodine which affects the substrate less than ion milling.

Figure 3A:
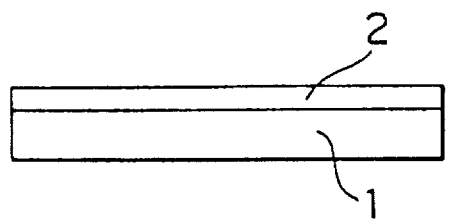
FIGS. 3A to 3D are sections showing sequential steps in the fabrication process of the non-linear element of the preferred embodiment of a mixer array antenna according to the present invention.
Figure 3B:
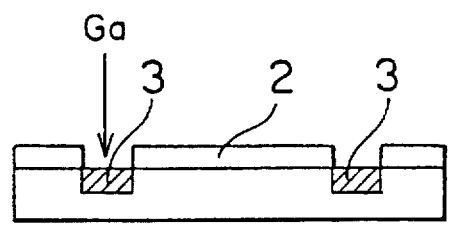
Figure 3C:
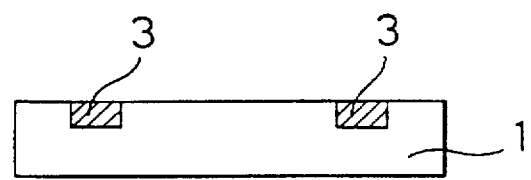
Figure 3D:
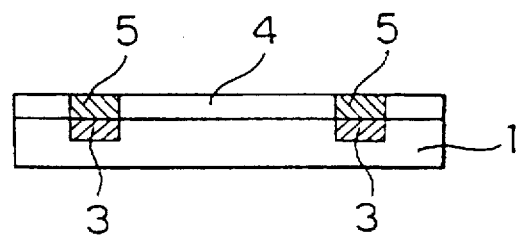
Figure 4A:
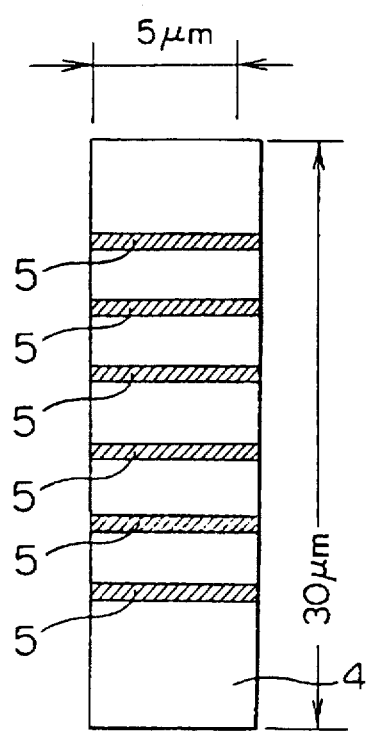
FIG. 4 is a plan view and a sectional view showing one example of a non-linear element of the superconductor in the preferred embodiment of the mixer array antenna according to the invention.
Figure 4B:
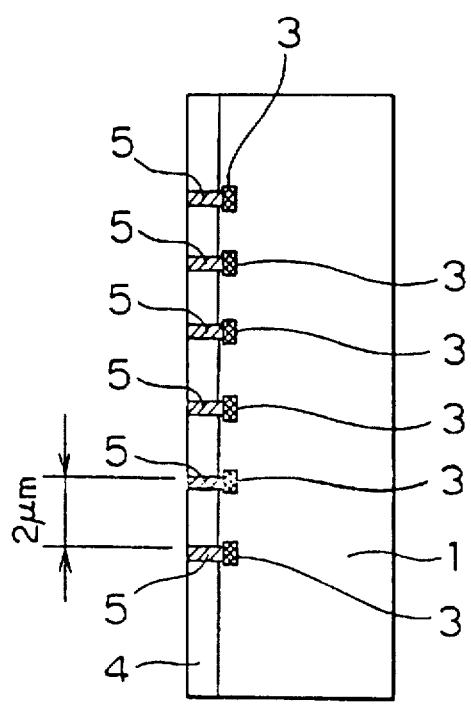

Thereafter, as shown in FIG. 3D, YBCO film 4 is deposited by pulse laser deposition in the thickness of 300 nm over the entire surface of the substrate. This YBCO film, on the Ga irradiated region 3, becomes a modified region which serves as a normal conductor region 5 thus forming an SNS (Superconductor-Normal-Superconductor) Josephson junction.

FIG. 4 shows the plan view and sectional side elevation of the non-linear element in the case where 6 Josephson junctions have been formed by a Ga⁺ ion beam of 50 nm diameter irradiated at 2 mm intervals. The non-linear element is patterned 5 mm by 30 mm. The remaining surface of the YBCO film 4 is patterned to form the antenna array shown in FIGS. 1 and 2. For the 2 patch antenna embodiment this provides an appropriate impedance match when the non-linear element is placed in a 50 ohm line such as location B of FIG. 1.

FIG. 5 schematically shows a construction of one embodiment of a feasibility demonstration for evaluating the characteristics of a superconducting mixing array antenna. In FIG. 5, 23 GHz RF signal 11 and 22 GHz LO signal 12 are transmitted from a single horn antenna 13 and irradiated on the array antenna 15 placed within a refrigerator 14. A quartz window 16 is provided in the refrigerator 14 so that the RF signal 11 and the LO signal 12 can illuminate antenna 15 when the antenna is placed in a heat insulated space. The 1 GHz IF signal passes through the feed line of the mixer array antenna 15, and is output 17 to the outside of the refrigerator 14. In addition, in order to provide direct current bias for the non-linear element of the mixer antenna, a current terminal 18 is also provided.

Figure 6:
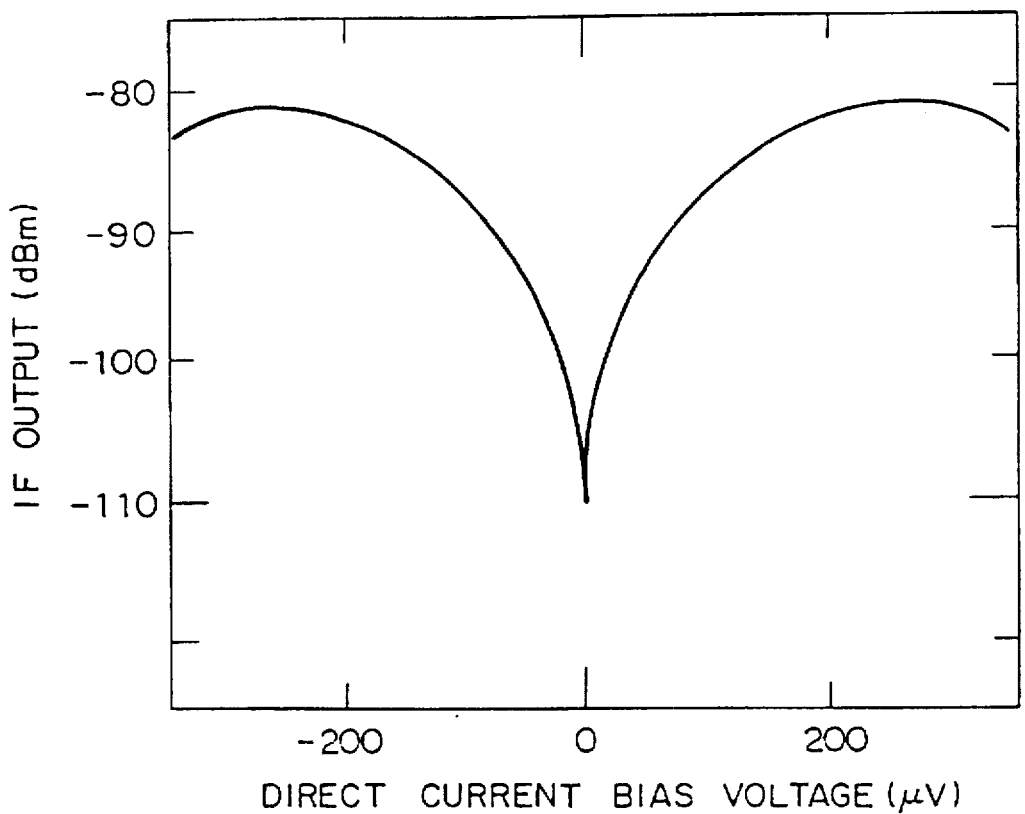
FIG. 6 is an illustration showing frequency transformation characteristics versus bias voltage characteristics of the preferred embodiment of the mixer array antenna.

FIG. 6 shows an example, in which the performance of a single patch type antenna 4c such as shown in FIG. 3 is measured in the equipment of FIG. 5. The distance between the horn antenna 13 and the antenna was approximately 10 cm. The temperature of the superconductor system was approximately 33° K. An IF signal output of −80 dBm was obtained with the RF signal 11 at −40 dBm and the LO signal 12 at −30 dBm. In FIG. 6, the vertical axis represents the IF signal output and the horizontal axis represents the bias voltage applied to the non-linear element 4a. The IF output was proportional to the RF input up to −20 dBm of RF signal. At higher inputs, the IF signal saturated and did not increase further.

The ability to transform frequency by forming non-linear Josephson junctions 4a at the location A of the array antenna allows a monolithic superconducting structure with reduced losses which can be operated at high frequencies above tens of GHz. This is a significant improvement over earlier work and allows an increased packaging density. The ability to control the impedance of the non-linear element by using as appropriate number of SNS junctions in series allows impedance matching without special circuitry.

The antenna of the present invention is readily adapted for beam steering by well-known techniques which control the phase and amplitude of the signals.

It should be noted that while MgO is employed as crystal substrate in the embodiment set forth above, the material for forming the substrate is not limited to MgO but can be SrTiO₃, NdGaO₃, LaAlO₃, LaGaO₃ and other similar materials and even crystal mixtures thereof. Also, while the mixer antenna array has been described as being constructed entirely from YBCO film on the substrate, it is obvious that the antenna portion can be formed as a hybrid structure of the superconductor and normal conductor or as solely the normal conductor.

Figure 7:
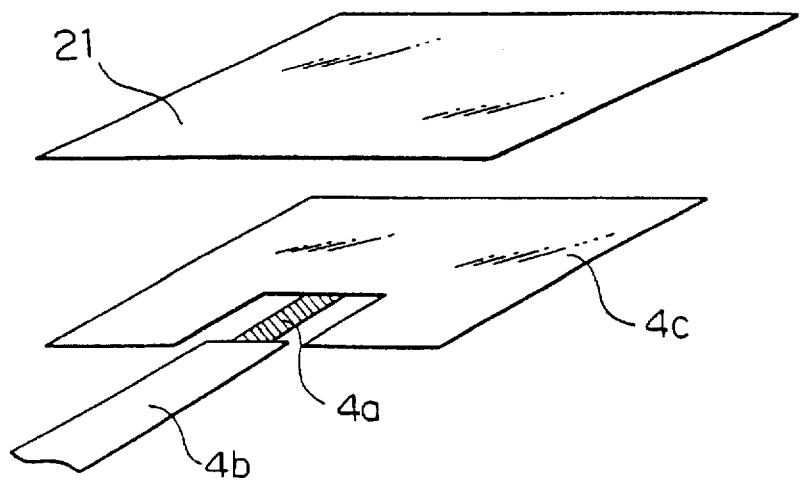
FIG. 7 is an illustration showing an alternate construction of a single antenna patch and non-linear element of a mixer array antenna.

While the embodiment where the patch type antenna and the feed line are formed on a single surface of the substrate has been discussed above, it is possible that the major part of the array antenna be constructed as illustrated in FIG. 7.

In the construction of FIG. 7, a second pattern 21 consisting of a superconductor or normal conductor is provided covering the portion of the patch pattern 4c. The second pattern 21 is coupled with the patch 4c in electromagnetic field coupling so that the second pattern 21 may serve as the antenna. Then, the patch pattern 4c may serve as a part of the feed line.

This invention provides a method for using only superconductors to convert a received high frequency RF signal to a lower frequency IF signal in a patch antenna array. This is accomplished by incorporating at least one non-linear Josephson junction into an antenna array. This Josephson junction functions as a mixer which receives both the RF signal and LO signal and, because of its non-linear characteristics, produces an IF signal at the difference frequency using well-known mixing techniques (ref. Maas, "Microwave Mixers", Artech House, Inc., Norwood, Mass., 1985). The lower frequency IF signal is then transmitted by means of a superconducting feed network to a signal detection means. In this way, very high frequency signals (above tens of GHz) can be received with low losses. This invention allows impedance matching of the mixer to the antenna impedance by using a series of junctions the sum of whose impedance provides the match when connected at the proper location in the antenna patch. Proper mixer biasing terminals are also provided. The LO signal can be supplied by irradiating onto the antenna/mixer or it may be directly injected into the antenna/mixer circuit say by a micro strip line.

Another aspect of the invention concerns a fabrication process comprised of a series of steps which form a non-linear Josephson junction element through the use of a focused ion beam (FIB) to modify the substrate before depositing an oxide superconducting film. The superconductor is then patterned to form the Josephson junction(s) and the antenna patches and feed network. The superconductor film is preferably an oxide superconductor of YBaCuO compound. A ground plane, which can be either normal or superconducting, is provided on the opposite surface.

Although the invention has been illustrated and described with respect to exemplary embodiments thereof, it should be understood by those skilled in the art that the foregoing and various other changes, omissions and additions may be made therein and thereto, without departing from the spirit and scope of the present invention. Therefore, the present invention should not be understood as limited to the specific embodiments set out above but to include all possible embodiments which can be embodied within the scope encompassed and equivalents thereof with respect to the features set out in the appended claims.

What is claimed is:

1. A superconductor mixing antenna array comprising:

a substrate;

a plurality of superconductor film wiring patterns formed on one surface of said substrate, each superconductor film wiring pattern comprising:

an antenna patch for receiving a radio frequency signal, a non-linear superconductor element connected to each antenna patch for transforming the frequency of the received radio frequency signal to an intermediate frequency signal by mixing with a local oscillator signal, thus forming an antenna/mixer element, and a superconductor feed network connected to each of the antenna/mixers which transmits the intermediate frequency signal to signal detection means at its output; and a ground plane on the opposite surface of the substrate.

2. The superconductor mixing antenna array of claim 1, wherein the non-linear superconductor element is a Josephson junction.

3. The superconductor mixing antenna array of claim 1, wherein the non-linear superconductor element is connected to a portion of said antenna patch having an impedance close to the impedance of the non-linear superconductor element for impedance matching purposes.

4. The superconductor mixing antenna array of claim 3, wherein the non-linear superconductor element is comprised of a group of Josephson junctions connected in series such that the impedance of the group of Josephson junctions is close to that of the antenna patch for impedance matching purposes.

5. The superconductor mixing antenna array of claim 1, wherein said superconductor film wiring pattern is formed of an oxide superconductor consisting of YBaCuO compound.

6. A process for the fabrication of a superconductor mixing antenna array comprising a non-linear superconductor element comprising the steps of:

depositing a protection layer on a substrate in the region where the non-linear element is to be formed;

focusing an ion beam on selected areas of the protected substrate where the non-linear element is to be formed;

removing the protection layer;

depositing a superconductor oxide film on both the irradiated and non-irradiated regions of the substrate to form modified superconductor film regions and un-modified superconductor regions, respectively;

patterning an area encompassing the modified superconductor film region to form the non-linear element; and patterning the un-modified superconductor regions to form the antenna patches and the feed network.

* * * * *

UNITED STATES PATENT AND TRADEMARK OFFICE
CERTIFICATE OF CORRECTION

PATENT NO. : 5,790,078
DATED      : August 4, 1998
INVENTOR(S) : Suzuki, et al.

It is certified that error appears in the above-identified patent and that said Letters Patent is hereby corrected as shown below:

**On the face of the patent, in the Assignee information, include --
INTERNATIONAL SUPERCONDUCTIVITY TECHNOLOGY CENTER,
TOKYO, JAPAN; E.I. DU PONT DE NEMOURS AND COMPANY,
WILMINGTON, DELAWARE--.**

Signed and Sealed this

Twenty-first Day of September, 1999

*Attest:*

Q. TODD DICKINSON

*Attesting Officer*   *Acting Commissioner of Patents and Trademarks*